United States Patent [19]

Theroux

[11] 4,349,831

[45] Sep. 14, 1982

[54] SEMICONDUCTOR DEVICE HAVING GLASS AND METAL PACKAGE

[75] Inventor: Jean P. Theroux, Marcellus, N.Y.

[73] Assignee: General Electric Company, Syracuse, N.Y.

[21] Appl. No.: 71,834

[22] Filed: Sep. 4, 1979

[51] Int. Cl.³ .................... H01L 23/02; H01L 23/12; H01L 23/30

[52] U.S. Cl. ........................................ 357/74; 357/73; 357/68; 357/81

[58] Field of Search ................ 357/74, 73, 81, 68

[56] References Cited

U.S. PATENT DOCUMENTS

| | | | |
|---|---|---|---|
| 2,868,862 | 1/1959 | Petri | 357/73 |
| 2,881,369 | 4/1959 | Carman | 357/73 |
| 2,956,160 | 10/1960 | Sharpless | 357/74 |
| 2,975,928 | 3/1961 | Roovers | 357/74 |
| 3,223,903 | 12/1965 | Solomon | 357/74 |
| 3,265,805 | 8/1966 | Carlan et al. | 357/81 |
| 3,501,680 | 3/1970 | Martin et al. | 357/74 |
| 3,515,955 | 6/1970 | Butenschow | 357/74 |
| 3,560,180 | 2/1971 | Merat | 357/73 |
| 3,735,211 | 5/1973 | Kapnias | 357/74 |
| 3,760,237 | 9/1973 | Jaffe | 357/74 |
| 3,831,067 | 8/1974 | Wislocky et al. | 357/74 |
| 4,159,221 | 6/1979 | Schuessler | 357/74 |
| 4,233,620 | 11/1980 | Darrow et al. | 357/74 |
| 4,249,034 | 2/1981 | Fichot et al. | 357/76 |

Primary Examiner—Andrew J. James
Attorney, Agent, or Firm—Robert J. Mooney

[57] ABSTRACT

A semiconductor package of low cost is described having a flat base to which is attached a semiconductor subassembly which is enclosed by a glass housing adhesively bonded to the base without the necessity for a compression glass-to-metal seal. An electrode is provided which extends through the glass housing to contact the semiconductor subassembly, a similar seal being provided between the electrode and the glass housing. Low residual stress soft solder interfaces are provided to the semiconductor element.

12 Claims, 1 Drawing Figure

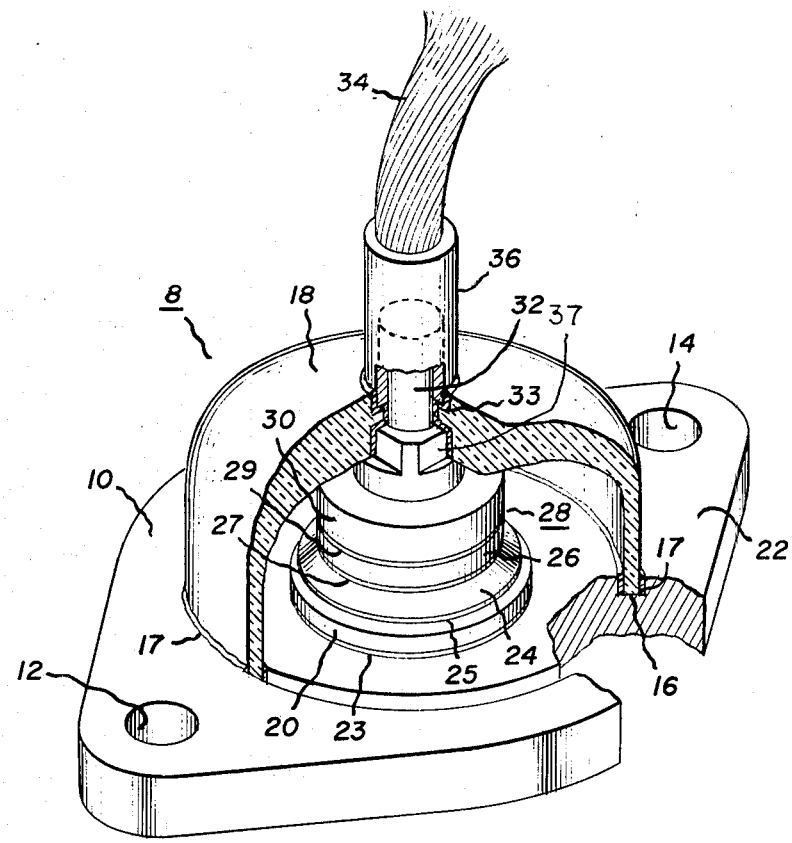

SEMICONDUCTOR DEVICE HAVING GLASS AND METAL PACKAGE

This invention relates in general to packages for semiconductor devices and more particularly to a low cost, hermetic package for a semiconductor device.

The packaging of semiconductor devices including diodes, transistors, thyristors, and the like, represents a substantial portion of the value of many devices and requires considerable effect in order to provide a package which exhibits the desired electrical and mechanical characteristics for securely packaging the device which is oftentimes especially delicate and easily damaged, while also providing good electrical connection to the device. In addition, the package must be designed so as to maintain its characteristics during the lifetime of the device including what may be severe conditions of thermal cycling, changing environments, mechanical shock, and other conditions well known to those skilled in the art. Further, it is of course desirable to keep the cost of a package for a semiconductor device as low as possible, increased costs being difficult to justify inasmuch as the package itself does not add to the electrical capabilities of the device enclosed therein, the best package being one which does not significantly reduce those capabilities.

Conventionally, packages for devices of the type to which this invention is addressed have included a heatsink portion of substantial mass constructed of a material which exhibits a low thermal impedance, typically copper. The heatsink portion of the device package has oftentimes represented a substantial cost in material alone. Conventionally, the semiconductor element may seal within a hermetic or nearly hermetic enclosure by joining to such a metal heatsink member a ceramic cap which joining is accomplished by a compression seal or the like. While the cost of such a ceramic cap may not itself be high, the cost of joining the cap to a thermally conductive base is substantial. Such a structure as illustrated, for example, in U.S. Pat. No. 3,585,454. In addition to the problems attendant to sealing a cap to a metallic base member, an additional point of potential weakness exists where one or more electrical leads passes through the cap to provide electrical connection to the semiconductor element. These leads must be attached to the cap to provide both adequate mechanical strength to insure that they will not become separated therefrom during handling or during connection to an external circuit; and a seal must be formed between the electrical lead or leads and the cap which does not destroy the hermeticity of the package as a whole.

Glass-to-metal seals which are of the compression type have been used in semiconductor device manufacturing for some time. Such seals are costly to produce. A glass-to-metal seal of a hybrid type is illustrated by Petri in U.S. Pat. No. 2,868,862 which requires an additional protective metal sleeve around the adhesive bond to protect it from degradation by the atmosphere. Roberts, U.S. Pat. No. 3,585,454, shows a semiconductor device of complex construction having a ceramic cap attached by unspecified means to a ring which is welded to a heat sink.

Recently, semiconductor packages have begun to appear which employ plastics in the construction thereof. Typically, such plastics are employed as a substitute for the ceramic cap element hereinabove described. A disadvantage attendant the use of a plastic cap is that a true hermetic package may not be obtained due to the permeability of plastic materials to elements which are harmful to the semiconductor device.

It is an object of this invention to provide a hermetic semiconductor package at low cost.

It is another object of this invention to provide a hermetic semiconductor package which uses a glass element for enclosing a semiconductor device in combination with a thermally conductive base.

It is another object of this invention to provide a semiconductor package which exhibits superior temperature cycling characteristics and long life.

It is still another object of this invention to provide a semiconductor package which is easy to assemble and is physically strong.

Briefly stated and in accordance with a presently preferred embodiment of this invention, a semiconductor package is provided which includes a relatively thin base having high thermal conductivity and which may be fabricated of, for example, copper. A first thermal stress relief plate which may be formed of molybdenum is attached to the base for example by a solder layer. A silicon semiconductor element is attached to the molybdenum stress relief plate also by a second solder layer, and a second stress relief plate which may also be formed of molybdenum is similarly attached to the opposite surface of the semiconductor element. A second electrode which may also be of copper is likewise attached to the second stress relief plate. A subassembly is thus formed which includes a semiconductor element which for purposes of illustrating this invention is considered to be an element of silicon but which may be any semiconductor material known to those skilled in the art, first and second stress relief plates bonded to first and second major surfaces of the semiconductor device, and first and second low resistance electrodes connected to the stress relief plates. A glass cap is disposed in sealing relationship with the upper and lower electrodes, a seal being formed through the use of an epoxy adhesive layer between the cap and each of the two electrodes. The upper electrode extends through the cap to provide electrical connection to the upper surface of the semiconductor device while the lower electrode functions as the lower mounting base for the device, and to seal the enclosure in which the semiconductor element is disposed.

In accordance with a presently preferred embodiment of this invention, the upper electrode is provided with a locking portion to secure the electrode to the cap to prevent mechanical stress from being transmitted to the semiconductor element. This isolation of the semiconductor element from external stress greatly enhances the performance of the device over its lifetime. A seal between the glass cap and the upper electrode is also formed within epoxy adhesive layer.

The semiconductor device thus formed is hermetic, thus avoiding the problems attendant the use of plastic materials in semiconductor devices which relate to the permeability of the plastic. Additionally, the device is of simple construction and easy to assemble. It provides a low stress environment for the semiconductor element and utilizes a minimum amount of expensive materials, such as copper and ceramic.

The features of the invention which are believed to be novel are pointed out with particularity in the appended claims. The invention itself, however, both as to its organization and method of operation together with further objects and advantages thereof, may best be understood by reference to the following description taken in connection with the accompanying drawings in which:

FIG. 1 is a cut-away perspective view of a semiconductor device in accordance with this invention.

Referring now to FIG. 1, there is shown a semiconductor device 8 in accordance with this invention. The device includes a thermally conductive base member 10 which preferably also exhibits low electrical resistance and which is adapted to be mounted, for example, by bolts, rivets, or the like disposed in apertures 12 and 14, to a flat surface which preferably provides for the conduction of heat away from the device. Base 10 may be fabricated from any thermally and electrically conductive material such as copper, aluminum, steel, or the like. Although copper is the most costly of these materials, it is presently preferred and the design of Base 10 utilizes a relatively small amount of material compared to prior art designs which have included large threaded stud portions for attaching the semiconductor device to a mounting surface. Base member 10 includes an annular groove 16 in the upper surface thereof for receiving the lower peripheral portion of cover member 18 for both locating cover member 18 and for increasing the sealing area as will hereinbelow be more completely described. A first stress relief element 20 is disposed on upper surface 22 of base member 10 in low thermal and electrical impedance contact therewith as provided, for example, by soldering layer 23. Semiconductor element 24 is connected to the upper surface of stress relief member 20 by solder layer 25, and a second stress relief member 26 is connected to the upper surface of semiconductor element 24 by solder layer 27. An electrically conductive electrode 28 is connected to the upper surface of stress relief member 26 by solder layer 29, and may, preferably, include an enlarged end portion 30 which in size, approximates the diameter of stress relief element 26. Electrode 28 further includes an upstanding portion 32 which extends through cover member 18 to which a flexible wire lead 34 may be attached. Such attachment may conveniently be made by coupling means 36 as is well known to those skilled in the art. Locking portion 37 of electrode 28 includes a plurality of flats for engaging a similarly shaped interior surface of cover 18 for preventing stress from being transmitted to semiconductor element 24.

In accordance with a presently preferred exemplary embodiment of this invention, base member 10 comprises a copper element for high thermal conductivity as well as low electrical resistance. Conveniently, base 10 may have a thickness of about 0.125 inches. In order to minimize the cost of a semiconductor device in accordance with this invention, it is preferable that base 10 be formed by punching or stamping rather than by machining, and to this end, groove 16 is preferably formed therein by stamping, rather than by milling. It is preferred that semiconductor wafer 24 along with stress relief members 20 and 26 be fabricated as a subassembly prior to the final assembly of the device illustrated in the FIGURE. Conveniently, these elements may be assembled in sandwich-like relationship with solder preforms disposed between the elements, then placed in an oven, or the like, for heating to a temperature sufficient to form a solder bond between the semiconductor element 24 and the two stress relief members. Stress relief members 20 and 26 are selected to have a coefficient of thermal expansion between those of the semiconductor element and base 10 and electrode 28. Preferably, they are formed of molybdenum and may have a thickness of about 0.020 inches. Preferably, soft solder connecting layers are provided so as to minimize the stress on semiconductor element 24 during thermal cycling of the device. After the subassembly including the semiconductor wafer and the two stress relief members is assembled, connection is simultaneously made to base member 10 and to upper electrode 30. This operation may also be carried out by disposing a solder preform between the semiconductor subassembly and the base and upper electrode, respectively, and heating the combination to a temperature sufficient to form a solder bond.

After the base, the semiconductor subassembly, and the upper electrode have been joined, cover 18 is attached. It is a particular advantage of this invention that a compression glass-metal seal is not required to be formed. Cover 18 is adhesively attached to base 10 by adhesive layer 17, with its bottom rim in groove 16, and to electrode 30 by adhesive layer 33. The selection of a particular adhesive for both physically attaching cover 18 to electrode 30 and base 10 as well as for forming a hermetic seal therebetween is somewhat critical. The seal must be hermetic, which is herein understood to designate a leak rate of no more than $10^{-9}$ std. cc. of helium per second; to be impermeable to moisture; and to exhibit thermal characteristics which allow it to withstand temperature cycling without degradation. The adhesive must be thermally and chemically compatible with both the base and with the glass and upper electrode materials selected. While in the past, glass-filled epoxies have been used for fabricating case members of the type exemplified herein by case 18, this invention uses an essentially pure glass which is preferably a glass as, for example, Type 7052 Black Glass manufactured by Corning Corporation. An adhesive having particularly favorable properties for use in this invention is Epo-tek H77 Epoxy manufactured by Epoxy Technology, Inc., Billerica, Mass. Preferably, the coefficient of thermal expansion of the epoxy should be essentially equal to that of the material selected for the base member and the electrode. The coefficient of expansion for copper is $16.5 \times 10^{-6}$ in/°C., while that for the above identified epoxy is $17.4 \times 10^{-6}$ in/°C. The glass should be selected to have an operating temperature range of $-50°$ to $200°$ C., the above-identified glass being an example, and the glass should also be capable of forming a hermetic bond with the adhesive.

A semiconductor package has been described which combines the low cost and high performance which are so desirable in present-day applications. This package completely eliminates the need for compression glass-to-metal seals heretofore required by the prior art to fabricate semiconductor packages of similar performance. Further, the package employs only low cost materials.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:
1. A semiconductor device comprising:
a base member having a first surface;
a semiconductor subassembly attached to said first surface, said subassembly including a semiconduc- tor element and first and second stress relief members bonded to first and second surfaces of said element respectively;

an electrode attached to said semiconductor subassembly, said electrode including a locking portion;

bell shaped glass cover means surrounding said semiconductor subassembly and having an opening for passing said electrode therethrough, said glass cover means including means for engaging said locking portion of said electrode; and adhesive sealing means joining said glass cover means to said base member and to said electrode including said locking portion to form a hermetic enclosure containing said semiconductor subassembly.

2. The device of claim 1 wherein said adhesive sealing means comprises an epoxy adhesive having a coefficient of thermal expansion essentially the same as the coefficient of thermal expansion of said base member.

3. The device of claim 2 wherein said glass cover means comprises glass having an operating temperature range extending between about −50° C. and +200° C.

4. The device of claim 3 and further comprising means for increasing the sealing area between said glass cover means and said base.

5. The device of claim 4 wherein said means for increasing the sealing area comprisees a groove in said base surrounding said semiconductor subassembly for receiving said glass cover means therein.

6. The device of claim 4 wherein said semiconductor element comprises at least one p-n junction therein, and said first and second stress relief members are bonded to said semiconductor element, to said base member and to said electrode, respectively.

7. The device of claim 6 wherein said semiconductor element, said base member and said electrode are joined by soft solder layers disposed therebetween.

8. A semiconductor device comprising:

a substantially flat base member having high thermal conductivity and having a mounting groove in a first surface thereof;

a first stress relief member having high thermal and electrical conductivity positioned on said first surface surrounded by said mounting groove;

a flat semiconductor element positioned with one surface thereof in contact with said first stress relief member;

a second stress relief member positioned in contact with the other surface of said semiconductor element;

electrode means having high electrical conductivity and being connected to said second stress relief member, said electrode means including a locking portion having a plurality of flats;

bell shaped glass cover means positioned in said mounting groove and extending above said first surface to form a hermetic chamber enclosing said semiconductor element, said glass cover means including an aperture through which said electrode means extends, said aperture including a plurality of mating surfaces for engaging the flats on said locking portion, said locking portion being adapted to secure said glass cover means to said electrode means to prevent mechanical stress from being transmitted to said semiconductor element;

first adhesive sealing means disposed in said mounting groove for hermetically sealing said glass cover means to said base member; and second adhesive sealing means disposed in said aperture for hermetically sealing said glass cover means to said electrode means including said locking portion.

9. The semiconductor device of claim 8 wherein said first and second adhesive sealing means comprise first and second layers of thermally conductive adhesive disposed between said glass cover means and said base member and between said glass cover means and said electrode means, respectively.

10. The semiconductor device of claim 9 wherein said base member consists of copper.

11. The semiconductor device of claim 9 and further comprising first through fourth layers of solder disposed respectively between said base member and said first stress relief member, said first stress relief member and said semiconductor element, said semiconductor element and said second stress relief member, and said second stress relief member and said electrode means.

12. The semiconductor device of claim 11 wherein said semiconductor element includes at least one p-n junction therein.

* * * * *